United States Patent
Yang

(10) Patent No.: US 8,199,470 B2
(45) Date of Patent: Jun. 12, 2012

(54) COVER MECHANISM AND ELECTRONIC DEVICE USING THE SAME

(75) Inventor: Zeng-Kui Yang, Shenzhen (CN)

(73) Assignees: ShenZhen Futaihong Precision Industry Co., Ltd., ShenZhen, Goangdong Province (CN); FIH (Hong Kong) Limited, Kowloon (HK)

( * ) Notice: Subject to any disclaimer, the term of this patent is extended or adjusted under 35 U.S.C. 154(b) by 216 days.

(21) Appl. No.: 12/701,662

(22) Filed: Feb. 8, 2010

(65) Prior Publication Data

US 2011/0063780 A1 Mar. 17, 2011

(30) Foreign Application Priority Data

Sep. 14, 2009 (CN) ................ 2009 2 0310306 U

(51) Int. Cl.
*G06F 1/16* (2006.01)
*H05K 5/00* (2006.01)
*H05K 7/00* (2006.01)

(52) U.S. Cl. ............ 361/679.02; 361/679.58; 455/575.8

(58) Field of Classification Search ............. 361/679.02, 361/679.37–679.45, 679.58; 455/575.8
See application file for complete search history.

(56) References Cited

U.S. PATENT DOCUMENTS

| 5,815,379 | A * | 9/1998 | Mundt ..................... 361/679.55 |
| 6,000,550 | A * | 12/1999 | Simpson et al. ............. 206/711 |
| 6,036,535 | A * | 3/2000 | Whiteman et al. ........... 439/519 |
| 6,099,097 | A * | 8/2000 | Hocker et al. ................ 312/327 |
| 6,102,501 | A * | 8/2000 | Chen et al. .................. 312/223.2 |
| 6,267,608 | B1 * | 7/2001 | Yagi .............................. 439/142 |
| 6,343,945 | B1 * | 2/2002 | Liikanen ....................... 439/160 |
| 6,595,608 | B1 * | 7/2003 | Minelli et al. ................ 312/296 |
| 6,614,481 | B1 * | 9/2003 | Sasaki ........................... 348/373 |
| 7,048,556 | B2 * | 5/2006 | Stanton et al. ............... 439/135 |
| 7,058,435 | B2 * | 6/2006 | Yamazaki .................. 455/575.8 |
| 7,121,637 | B2 * | 10/2006 | Fang ......................... 312/223.2 |
| 7,123,487 | B2 * | 10/2006 | Saito et al. .................... 361/801 |
| 7,203,529 | B2 * | 4/2007 | Kim et al. .................. 455/575.1 |
| 7,309,016 | B2 * | 12/2007 | Lev et al. .................. 235/472.01 |
| 7,327,566 | B2 * | 2/2008 | Zhao ........................ 361/679.33 |
| 7,500,866 | B2 * | 3/2009 | Gennai et al. ................ 439/367 |
| 7,611,371 | B2 * | 11/2009 | Guo .............................. 439/367 |
| 7,742,294 | B2 * | 6/2010 | Gadau et al. ............. 361/679.43 |
| 7,798,828 | B2 * | 9/2010 | Kuo ............................. 439/142 |
| 2002/0119697 | A1 * | 8/2002 | Chan ............................ 439/519 |
| 2004/0258336 | A1 * | 12/2004 | Hou .............................. 384/276 |
| 2005/0049016 | A1 * | 3/2005 | Cho et al. .................. 455/575.1 |
| 2006/0078326 | A1 * | 4/2006 | Ariga ............................ 396/419 |
| 2006/0154520 | A1 * | 7/2006 | Gennai et al. ................ 439/578 |
| 2007/0019389 | A1 * | 1/2007 | Du ................................ 361/728 |
| 2009/0141445 | A1 * | 6/2009 | Lu ........................... 361/679.55 |
| 2009/0270136 | A1 * | 10/2009 | Su et al. ....................... 455/572 |

* cited by examiner

*Primary Examiner* — Jinhee Lee
*Assistant Examiner* — Adrian S Wilson
(74) *Attorney, Agent, or Firm* — Altis Law Group, Inc.

(57) ABSTRACT

A cover mechanism for an electronic device, and the cover mechanism includes a base member and a cover member. The base member defines an opening. The cover member includes a plate body and a pin positioned on the plate body. The plate body rotatably latches the base member by the pin, and covers the opening. The present disclosure further discloses an electronic device using the cover mechanism.

4 Claims, 4 Drawing Sheets

COVER MECHANISM AND ELECTRONIC DEVICE USING THE SAME

BACKGROUND

1. Technical Field

The present disclosure generally relates to cover mechanisms, and particularly to cover mechanisms used in electronic devices.

2. Description of Related Art

Electronic devices usually have external interfaces (e.g., universal serial bus (USB)) for electrically connecting peripheral devices (e.g., printers), accessories (e.g., USB flash drives) or other electronic devices. Such external interfaces should be protected by cover mechanisms from dust or water, to maintain proper functioning.

The cover mechanisms usually include covers with locks. The covers are typically locked to the electronic devices by latches to cover the area through which the interfaces of electronic devices are exposed. However, the covers are often not permanently attached to the electronic device. Thus, the covers may easily be misplaced or lost when not locked to the electronic devices.

Therefore, there is a room for improvement within the art.

BRIEF DESCRIPTION OF THE DRAWINGS

Many aspects of the cover mechanism and electronic device using the same can be better understood with reference to the following drawings. The components in the drawings are not necessarily to scale, the emphasis instead being placed upon clearly illustrating the cover mechanism and electronic device using the same. Moreover, in the drawings, like reference numerals designate corresponding parts throughout the several views.

DETAILED DESCRIPTION

Figure 1:
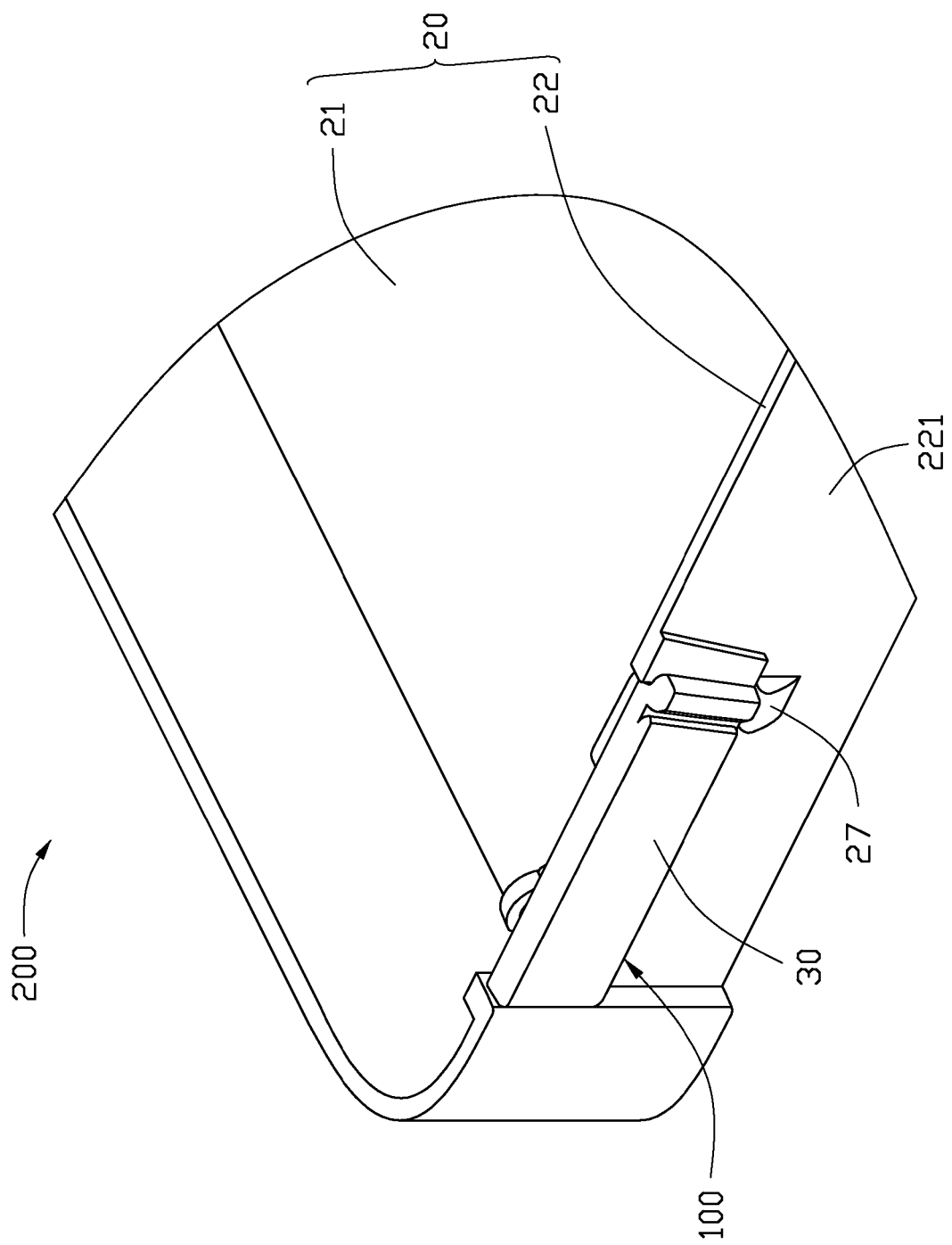
FIG. 1 is an assembled, isometric view of an exemplary cover mechanism used in an electronic device.
Figure 2:
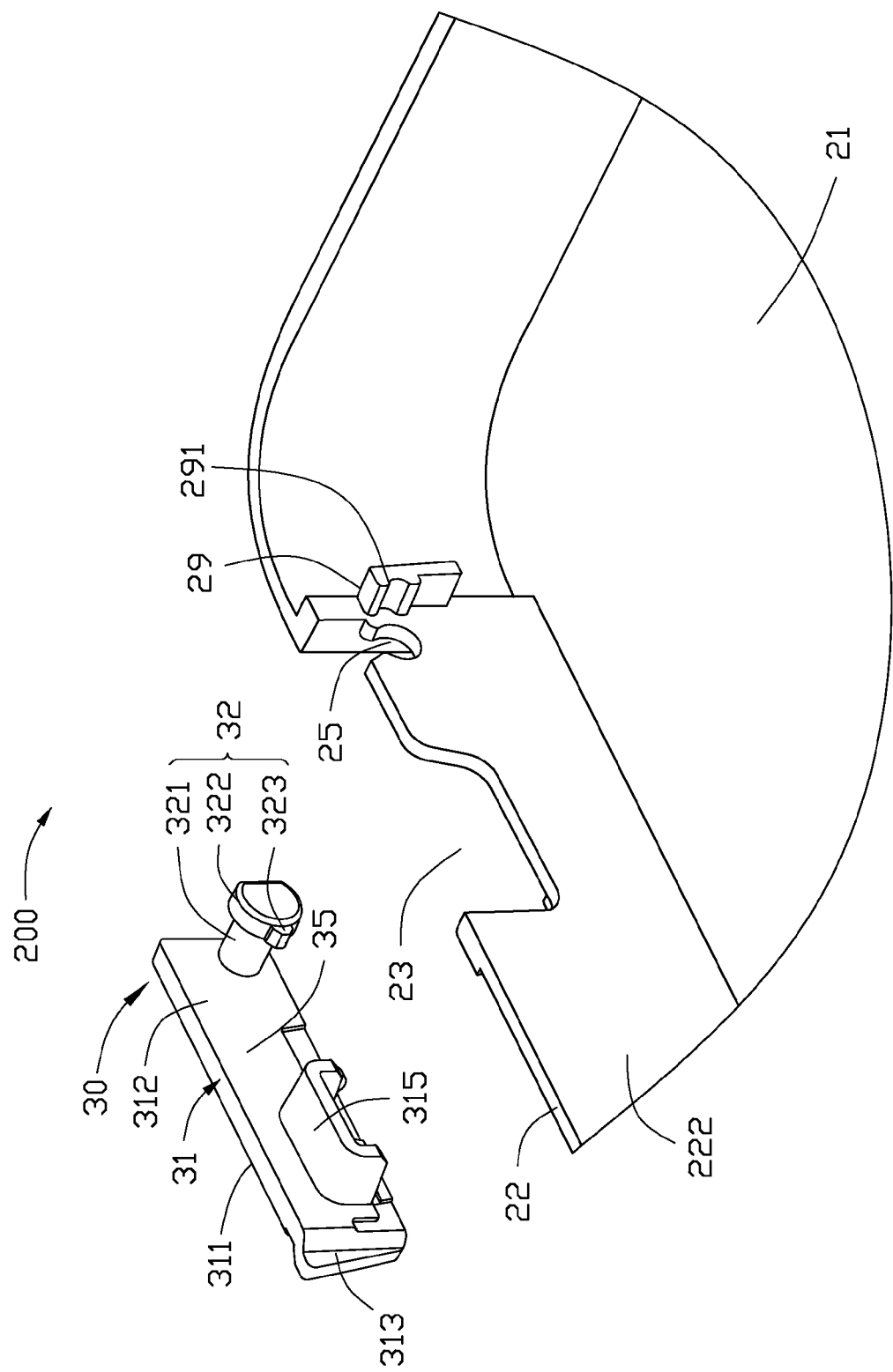
FIG. 2 is an exploded, isometric view of the exemplary cover mechanism shown in FIG. 1.

FIG. 1 and FIG. 2 show an exemplary cover mechanism 100 used in an electronic device 200, such as mobile phone, personal digital assistant, and so on.

The cover mechanism 100 includes a base member 20 and a cover member 30. The base member 20 may be portions of the electronic device 200 and includes a bottom wall 21 and a sidewall 22. The sidewall 22 includes an outer surface 221 and an inner surface 222. The sidewall 22 defines an opening 23 and a latching hole 25 adjacent to the opening 23. In this embodiment, the opening 23 is a connector interface hole. A resisting block 27 is positioned on the outer surface 221 opposite to the latching hole 25. A latching portion 29 extends from the inner surface 222 adjacent to the latching hole 25. A latching slot 291 is defined in the latching portion 29, and is aligned with the latching hole 25.

The cover member 30 includes a plate body 31 and a pin 32 positioned on the plate body 31. The plate body 31 includes a first surface 311 and an opposite second surface 312. A latching end 313 perpendicularly extends from a peripheral edge of the first surface 311 and is parallel with the plate body 31. The latching end 313 is configured for resisting the resisting block 27. A fixed portion 315 is positioned on the second surface 312 corresponding to the opening 23, and engages with the opening 23. Thus, the cover member 30 can tightly seal the opening 23.

The pin 32 can be integrally formed with the plate body 31. The pin body 32 includes a shaft portion 321, a flange portion 322, and a protrusion 323. The shaft portion 321 extends from the second surface 312. The flange portion 322 is columnar and positioned at a free end of the shaft portion 321. The flange portion 322 is wider than the shaft portion 321. The protrusion 323 extends from a periphery of the flange portion 322, and is for latching the latching slot 291.

Figure 3:
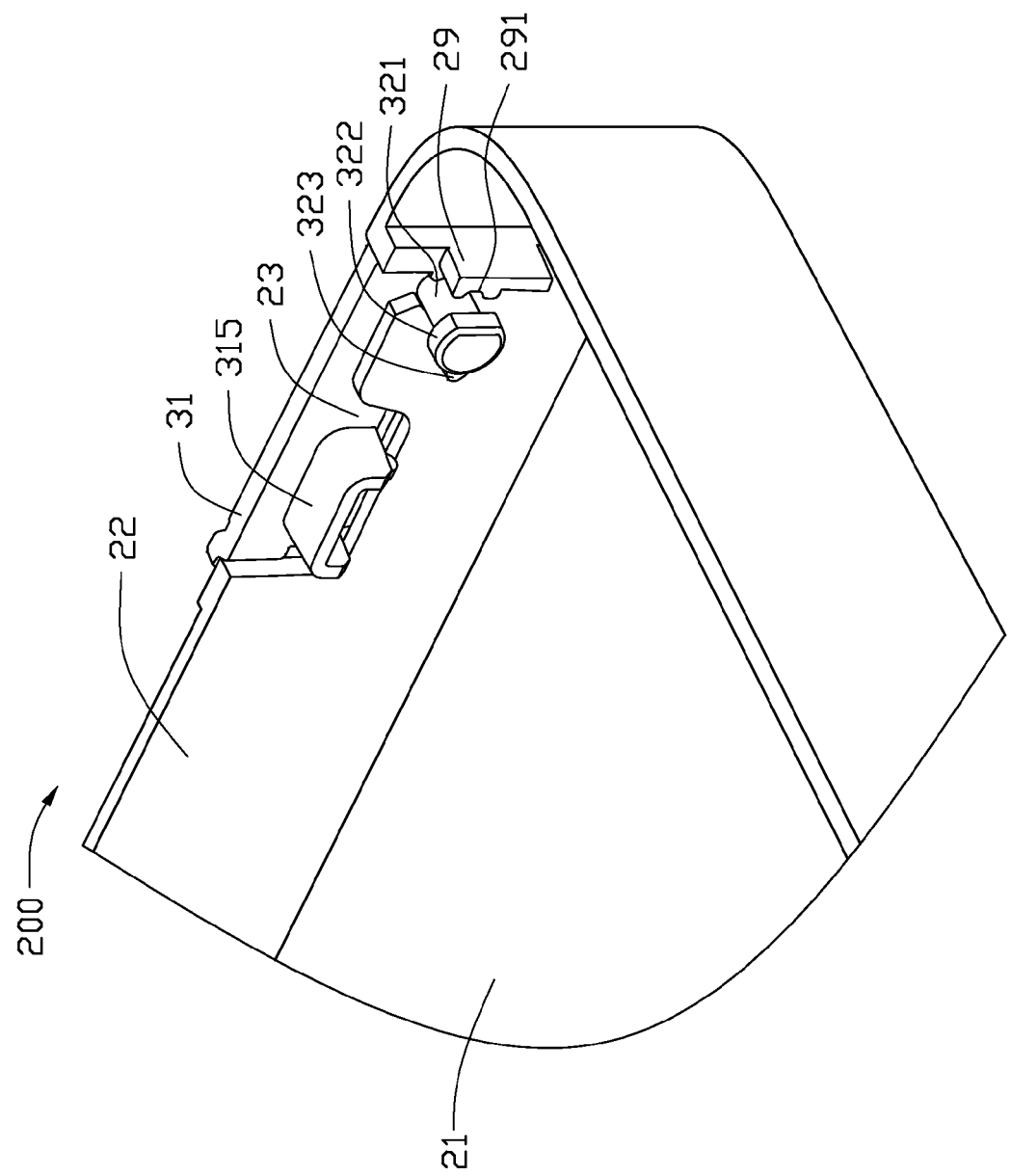
FIG. 3 is an assembled, isometric view of the exemplary cover mechanism shown in FIG. 1, but from another angle.

Referring to FIG. 3, when the cover member 30 is assembled to the base member 20, firstly, the shaft portion 321 is inserted into the latching hole 25, with the protrusion 323 positioned opposite to the latching slot 291. Then, the fixed portion 315 is inserted into the opening 23, and the latching end 313 resists the resisting block 27. Therefore, the cover member 30 is completely assembled to the base member 20 for protecting internal interfaces.

Figure 4:
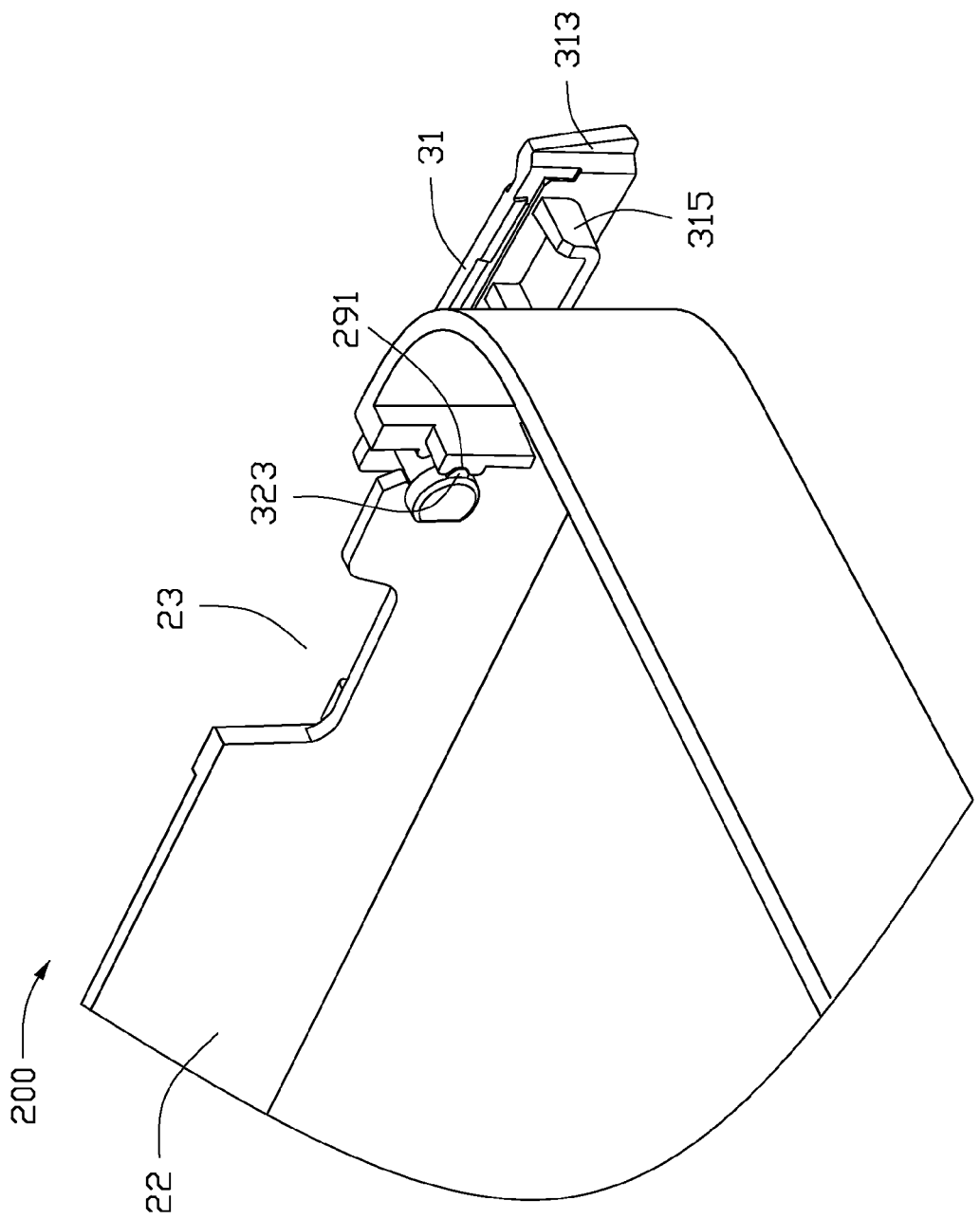
FIG. 4 is the cover mechanism shown in FIG. 3 in an opened state.

Referring to FIG. 4, when the cover member 30 is opened, the operator may hold the latching end 313 to separate one end of the cover member 30 from the sidewall 22. The shaft portion 321 is pulled out until the flange portion 322 contacts the inner surface 222. The plate body 31 can auto rotate. Then, the plate body 31 is rotated about 180° until the protrusion 323 latches to the latching slot 291. Thus, the cover member 30 is kept at a fixed position. The opening 23 is exposed from the cover member 30.

The plate body 31 is rotatably latched to the sidewall 22 by the pin 32. Therefore, when the opening 23 is exposed from the cover member 30, the cover member 30 may not easily be lost.

It is to be understood, however, that even through numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A cover mechanism for an electronic device, the cover mechanism comprising:
    a base member defining an opening and a latching hole adjacent to the opening, the base member including a latching portion defining a latching slot;
    a cover member including a plate body, a fixed portion extending from the plate body, and a pin positioned on the plate body, the pin including a shaft portion, a flange portion and a protrusion, the flange portion is positioned at a free end of the shaft portion, the protrusion extending from a periphery of the flange portion;
    wherein the pin is placed into the latching hole, and the protrusion is positioned opposite to the latching slot, the fixed portion is engaged in the opening to allow the cover member to hide the opening;
    wherein to expose the opening, the fixed portion disengages from the opening, the cover member is rotated to 180 degrees to align the protrusion with the latching slot, the shaft portion is pulled to axially move the protrusion toward the latching portion until the protrusion is latched in the latching slot to keep the cover member at a fixed position.

2. The cover mechanism as claimed in claim 1, wherein the base member includes a resisting block positioned thereon, the plate body includes a latching end perpendicularly extending from a peripheral edge thereof, and parallelly extends therewith; the latching end resists the resisting block.

3. An electronic device, comprising:
   a housing;
   a cover mechanism including a plate body, a fixed portion extending from the plate body, and a pin positioned on the plate body, the pin, comprising:
      a base member being a portion of the housing, the base member defining an opening and a latching hole adjacent to the opening the base member including a latching portion defining a latching slot; and
      a cover member including a plate body, a fixed portion extending from the plate body, and a pin positioned on the plate body, the pin including a shaft portion, a flange portion and a protrusion, the flange portion is positioned at a free end of the shaft portion, the protrusion extending from a periphery of the flange portion; the cover member rotatably fixed with the base member for movement between:
         a closed position, where the shaft portion is placed into the latching hole, and the protrusion is positioned opposite to the latching slot, the fixed portion is engaged in the opening, the cover member covers the opening, and
         an open position, where the cover member rotates about 180 degrees, the protrusion aligns with the latching slot, the fixed portion disengages from the opening, the shaft portion is pulled to axially move the protrusion toward the latching portion until the protrusion is latched in the latching slot to keep the cover member at a fixed position, and the opening is exposed.

4. The electronic device as claimed in claim 3, wherein the base member includes resisting block positioned thereon, the plate body includes a latching end perpendicularly extending from a peripheral edge thereof, and parallelly extends therewith; the latching end resists the resisting block.

\* \* \* \* \*